(12) United States Patent
Mehta et al.

(10) Patent No.: US 6,396,356 B1
(45) Date of Patent: May 28, 2002

(54) LINEARIZATION SCHEME FOR VOLTAGE CONTROLLED OSCILLATOR

(75) Inventors: Srenik Mehta, Pleasanton; Christopher Donald Nilson, San Jose, both of CA (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/576,839

(22) Filed: May 23, 2000

Related U.S. Application Data
(60) Provisional application No. 60/135,572, filed on May 24, 1999.

(51) Int. Cl.[7] .......................... H03B 5/08; H03B 51/12; H03L 7/099
(52) U.S. Cl. ................ 331/36 C; 331/177 V; 331/167
(58) Field of Search .................... 331/36 C, 177 V, 331/167; 332/100, 102, 136; 375/306

(56) References Cited

U.S. PATENT DOCUMENTS

| | | | |
|---|---|---|---|
| 4,755,774 A | 7/1988 | Heck | 332/123 |
| 4,866,404 A | 9/1989 | Vandegraaf | 332/127 |
| 5,107,228 A | 4/1992 | Pham et al. | 331/117 R |
| 5,254,958 A | * 10/1993 | Flach et al. | 331/177 V |
| 5,258,726 A | 11/1993 | Pham | 331/117 R |
| 5,493,715 A | * 2/1996 | Humphreys et al. | 331/177 V |
| 5,521,947 A | 5/1996 | Madsen | 375/375 |
| 5,650,754 A | 7/1997 | Joshi et al. | 331/36 C |

* cited by examiner

Primary Examiner—David Mis
(74) Attorney, Agent, or Firm—Merchant & Gould PC

(57) ABSTRACT

A VCO system for equalizing a positive frequency deviation and a negative frequency deviation by using two varactors is described. The VCO system includes an active circuit and an oscillating circuit. The active circuit includes a first input, a second input coupled to ground and an output. The oscillating circuit is coupled to the output of the active circuit, including: a first varactor controlled by a first variable voltage; a second varactor controlled by a second variable voltage, connected in parallel to the first varactor; and an inductor connected in parallel to the first varactor and to the second varactor. An output signal of the oscillating circuit is fed back to the first input of the active circuit. The output signal of the oscillating circuit has a variable frequency in response to first and second variable voltages of the first and second varactors, respectively.

5 Claims, 2 Drawing Sheets

$C_{TOTAL}=C_A+C_B$ (a) Normal $C_{TOTAL}=2C_A$
$\Delta C_{TOTAL}=2C_A-(C_A+C_B)=C_A-C_B$ (b) Modulation +

$C_{TOTAL}=2C_B$
$\Delta C_{TOTAL}=(C_A+C_B)-2C_B=C_A-C_B$ (c) Modulation −

LINEARIZATION SCHEME FOR VOLTAGE CONTROLLED OSCILLATOR

RELATED APPLICATIONS

This application claims the benefit of Provisional Application, U.S. Serial No. 60/135,572, filed on May 24, 1999, entitled "A LINEARIZATION SCHEME FOR VARACTOR-BASED FM-MODULATION", by Srenik Mehta, Christopher D. Nilson.

FIELD OF THE INVENTION

The present invention relates to voltage controlled oscillator (VCO) modulation. More particularly, this invention relates to varactor-based VCO fm-modulation

BACKGROUND OF THE INVENTION

Voltage controlled oscillator (VCO) circuits are well known in the art and are utilized in a number of applications. For example, VCO circuits are used in phase-locked loop (PLL) circuits in high frequency applications such as wireless communications. A PLL is a component used in communications circuitry that enables communications equipment to quickly "lock" onto a specifically selected frequency, typically the carrier frequency over which communications are sent. This fast locking ability is particularly important for devices such as cellular telephones, where the cell phones are desired to instantly switch carrier frequencies when traveling through different cellular zones or "cells". A VCO is an essential component of a PLL, whose output voltage is controllable by the application of an input control voltage. However, a VCO is very sensitive to fluctuations in a control voltage. The sensitivity of a VCO is typically expressed as MHz per volt.

Typically, a VCO circuit includes a variable element such as a capacitor that may be varied to adjust the frequency of an output signal of the VCO circuit. In a LC tank based VCO circuit, the frequency of the VCO circuit is determined by the inductance (L) and capacitance (C) of the tank circuit. By utilizing a varactor to function as a capacitor in the LC tank circuit, the capacitance of the VCO circuit can be varied by changing the voltage applied to the varactor. Thus, the frequency of the LC tank based VCO circuit is varied accordingly. However, the transfer characteristic of varactors is similar to reverse biased diodes which have a non-linear transfer characteristic. Thus, a symmetric voltage swing would result in an asymmetric deviation. Accordingly, sensitivity of a VCO is affected due to a non-linearized varactor.

FIG. 1 shows a schematic diagram illustrating a conventional LC tank based VCO circuit. VCO circuit 20 generally includes an active device, such as an amplifier 22, and a LC tank circuit 30 (labeled in dash lines). The amplifier 22 includes a first input 24 adapted for receiving a first input signal and a second input 26 adapted for receiving a second input signal. In this case, the second input 26 is connected to ground. The output of the amplifier 22 is an input of the LC tank circuit 30. An output of the LC tank circuit 30 is fed back to the first input 24. The LC tank circuit 30 is formed by an inductor 32 having inductance Lo, a capacitor 34 having capacitance $C_{LARGE}$ and a variable capacitor or varactor 36 having capacitance C(V) which is controlled by a voltage V. The inductor 32 is connected between node 38 and ground. One end of the capacitor 34 is connected to node 38, and the other end of the capacitor 34 is connected to the varactor 36. The other end of the varactor 36 is connected to ground.

The LC tank circuit 30 is operable to provide an output signal 40, whose frequency is determined by the inductance $L_O$, the capacitance $C_{LARGE}$, and the capacitance C(V). The frequency is changed by varying the capacitance C(V) of the varactor 36 which is controlled by the voltage V. As stated above, because the varactor 36 inherently has a nonlinear transfer characteristic, a symmetric voltage swing would result in an asymmetric deviation of the frequency. As shown in FIG. 2, during modulation, the symmetric deviation in voltage, i.e., $+\Delta V$, $-\Delta V$, results in different deviation in capacitance, $\Delta C1$ and $\Delta C2$ ($\Delta C1 \neq \Delta C2$), respectively, which in turn results in different frequency deviation. The resulting frequency f(V) equals to $[L_O \times C'(V)]^{-\frac{1}{2}}$, wherein $L_O$ is the inductance of the inductor 32, and C'(V) is the equivalent load capacitance of the capacitor 34 and the varactor 36 in series.

In order to solve the asymmetry problem, there is a need to provide an improved VCO circuit for equalizing the positive frequency deviation and the negative frequency deviation for a varactor-based VCO fm-modulation.

It is with respect to this and other considerations that the present invention has been made.

SUMMARY OF THE INVENTION

To overcome the limitations in the prior art described above, and to overcome other limitations that will become apparent upon reading and understanding the present specification, the present invention provides a technique for equalizing a positive frequency deviation and a negative frequency deviation for a varactor-based VCO fm-modulation. In one embodiment, two varactors are used.

In one embodiment of the present invention, the VCO comprises an active device, such as an amplifier, having a first input and a second input, and a LC tank circuit coupled to an output of the amplifier. An output of the LC tank circuit is fed back to the first input of the amplifier, while the second input of the amplifier is connected to ground. In the LC tank circuit, first and second varactors are provided. The first varactor is in series connection with a first capacitor having a first fixed capacitance. The second varactor is in series connection with a second capacitor having a second fixed capacitance. The LC tank circuit further includes an inductor which is in parallel to the series of the first varactor and the first capacitor, and in parallel to the series of the second varactor and the second capacitor.

In operation in accordance with the present invention, the VCO may be operated in a normal condition and positive/negative deviation conditions. In the normal condition, the control voltage for a first varactor is set to $V_A$ such that a load capacitance in a first series is $C_A$, while the control voltage for the other varactor is set to $V_B$ such that a load capacitance in a second series is $C_B$. Thus, the total load capacitance in the normal condition is $C_A + C_B$. During the positive deviation, the control voltage for both varactors is set to $V_A$ such that the total load capacitance is $2C_A$. During the negative deviation, the control voltage for both varactors is set to $V_B$ such that the total load capacitance is $2C_B$. Accordingly, the deviation in the load capacitance, $\Delta C$, for both negative and positive deviation is equal to $C_A - C_B$. Thus, $\Delta f$ is the same for both positive deviation and negative deviation. The nonlinearity of varactor based fm-modulation has thus been solved by providing a linearization scheme, such as using two varactors.

DETAILED DESCRIPTION OF THE PREFERRED EMBODIMENT

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a technique for equalizing a positive frequency deviation and a negative frequency deviation for an fm-modulated voltage controlled oscillator (VCO). In the following description, one exemplary technique of linearization scheme by using two varactors is discussed in detail. It is appreciated that other linearization schemes can be used to equalize a positive frequency deviation and a negative frequency deviation for an fm-modulated voltage controlled oscillator.

Figure 1:
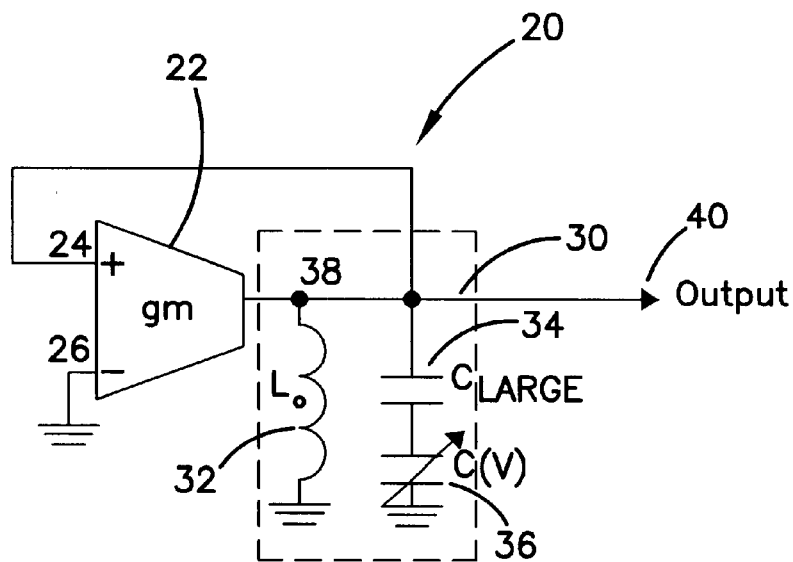
FIG. 1 shows a schematic diagram illustrating a conventional LC tank based VCO circuit.
Figure 2:
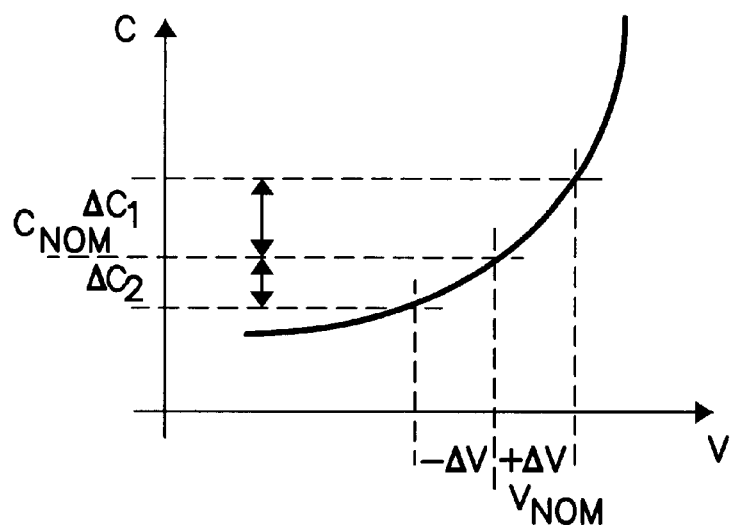
FIG. 2 shows a diagram illustrating V-C transfer characteristic of a variable capacitor which is controlled by a voltage.
Figure 3:
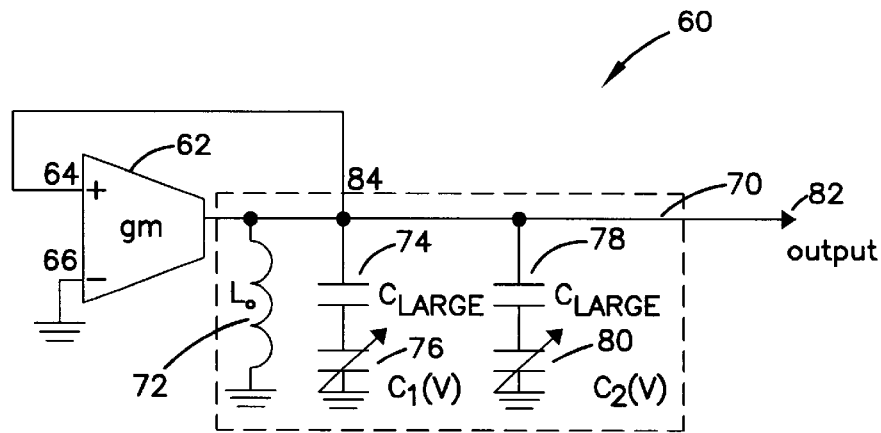
FIG. 3 shows a schematic diagram illustrating one embodiment of a LC tank based VCO circuit in accordance with the present invention.

Now referring to FIG. 3, which is a schematic diagram of one embodiment of a LC tank based VCO circuit in accordance with the present invention. As shown in FIG. 3, a VCO circuit 60 generally includes an active device, such as an amplifier 62, preferably having a fixed transconductance $g_m$, and a LC tank circuit 70. The amplifier 62 has a first input 64 for receiving a first input signal, and a second input 66 which is connected to ground. An output of the amplifier 62 is an input of the LC tank circuit 70, while an output of the LC tank circuit 70 is fed back to the first input 64 of the amplifier 62.

The LC tank circuit 70 includes an inductor 72 having inductance $L_0$, a first capacitor 74 having capacitance $C_{LARGE}$ in series connection with a first varactor 76 having a variable capacitance $C_1(V)$ controlled by a voltage V, and a second capacitor 78 having capacitance $C_{LARGE}$ in series connection with a second varactor 80 having a variable capacitance $C_2(V)$ controlled by a voltage V. The inductor 72 is connected in parallel to a first series between a node 84 and the ground in which the first capacitor 74 is in series connection with the first varactor 76. The inductor 72 is connected in parallel to a second series between the node 84 and the ground in which the second capacitor 78 is in series connection with the second varactor 80.

Figure 4A:
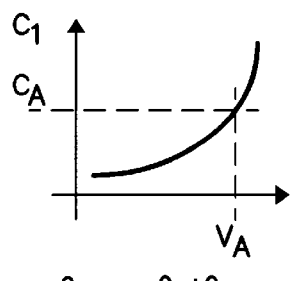
FIGS. 4a–c show a linearization scheme for one embodiment of a LC tank based VCO circuit in accordance with the present invention.
Figure 4A:
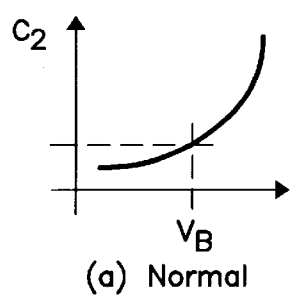
Figure 4B:
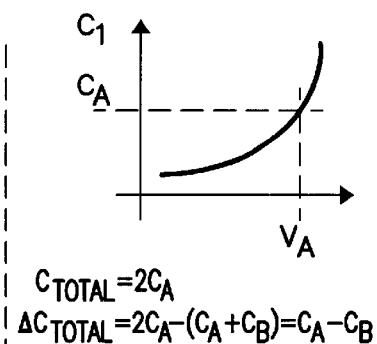
Figure 4B:
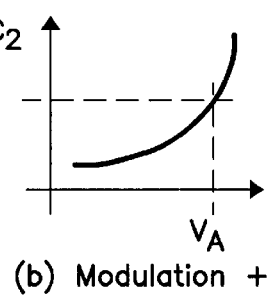
Figure 4C:
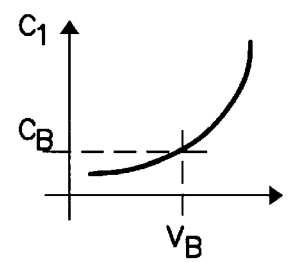
Figure 4C:
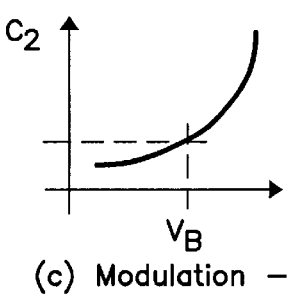

The output 82 of the LC tank circuit 70 is controllable by the variable voltages V of the varactors 76, 80. In FIGS. 4a–c, an operation of varying varactor voltages to control the load capacitance of the LC tank circuit 70 is illustrated. In a normal condition as shown in FIG. 4a, the voltage of the varactor 76 is set to $V_A$, and the voltage of the varactor 80 is set to $V_B$ ($V_A > V_B$). Accordingly, the load capacitance from the first series of the varactor 76 and the fixed capacitor 74 is $C_A$. The load capacitance from the second series of the varactor 80 and the fixed capacitor 78 is $C_B$. Thus, the total load capacitance in the normal condition $C_{TOTAL/NOM}$ is $C_A+C_B$. During a positive deviation as shown in FIG. 4b, both voltages of the varactors 76 and 80 are set to $V_A$, i.e., the varactor 76 is set to $V_A$ as in its normal condition, while the varactor 80 is changed from $V_B$ to $V_A$. Accordingly, the load capacitance of both first and second series is $C_A$, and the total load capacitance $C_{TOTAL/M+}$ is $2C_A$. In the deviation, the positive voltage deviation $+\Delta V$ is $V_A-V_B$, and the capacitance deviation $\Delta C_+ = C_{TOTAL/M+} - C_{TOTAL/NOM} = 2C_A - (C_A + C_B) = C_A - C_B$.

During a negative deviation as shown in FIG. 4c, both voltages of the varactors 76 and 80 are set to $V_B$, i.e., the varactor 76 is changed from $V_A$ to $V_B$, while the varactor 80 is set to $V_B$ as in its normal condition. Thus, the load capacitance of both first and second series is $C_B$, and the total load capacitance $C_{TOTAL/M-}$ is $2C_B$. In this deviation, the negative voltage deviation $-\Delta V = V_A - V_B$, and the capacitance deviation $\Delta C_- = C_{TOTAL/NOM} - C_{TOTAL/M-} = (C_A + C_B) - 2C_B = C_A - C_B$.

Thus, in the present invention, the symmetric deviation in voltage $\Delta V = \pm(V_A - V_B)$, results in a symmetric deviation in capacitance $\Delta C_+ = \Delta C_- = C_A - C_B$. Accordingly, a symmetric deviation in frequency $\Delta f$ is obtained, i.e., same $\Delta f$ for both positive and negative directions.

In the above scheme, the nonlinearity of the positive and negative deviation can be compensated by using two varactors, e.g., voltage controlled capacitors, to keep the same $\Delta f$ for both positive and negative directions. Also, the invention may use direct modulation of the VCO. In this embodiment, no other power consuming circuit, such as those used in a sigma-delta modulation of a PLL divider, needs to be used. Accordingly, the present invention provides a linearized VCO modulation with less power consumption and less circuitry.

It is appreciated that the present invention can be used in other types of modulation schemes, such as 4 varactors for 4-level frequency shift keying (FSK) modulation.

The forgoing description of the preferred embodiment of the invention has been presented for the purpose of illustration and description. It is not intended to be exhaustive or to limit the invention to the precise form disclosed. Many modifications and variations are possible in light of the above teaching. It is intended that the scope of the invention not be limited with this detailed description.

We claim:

1. A method of modulating a voltage controlled oscillator (VCO) system having an inductor, a first varactor controlled by a first variable voltage being connected in parallel to the inductor and a second varactor controlled by a second variable voltage being connected in parallel to the first varactor, comprising:

setting the first variable voltage of the first varactor to a first voltage, setting the second variable voltage of the second varactor to a second voltage in a normal condition;

setting both the first and the second varactors to the first voltage in a positive deviation condition; and setting both the first and the second varactors to the second voltage in a negative deviation condition;

wherein a frequency deviation of the system is linear in response to a voltage deviation from the normal condition to either the positive deviation condition or negative deviation condition.

2. The method as claimed in claim 1, wherein the first and second varactors are voltage controlled capacitors.

3. The voltage controlled oscillator system as claimed in claim 1, further comprising a first capacitor being connected in series with the first varactor, and a second capacitor being connected in series with the second varactor.

4. A computer program storage medium readable by a computing system and encoding a computer program of instructions for executing a computer process for modulating a voltage controlled oscillator (VCO) system, the computer process comprising:

setting a first variable voltage of a first varactor to a first voltage, setting a second variable voltage of a second varactor to a second voltage in a normal condition;

setting both the first and the second varactors to the first voltage in a positive deviation condition; and setting both the first and the second varactors to the second voltage in a negative deviation condition;

wherein a frequency deviation of the system is linear in response to a voltage deviation from the normal condition to either the positive deviation condition or negative deviation condition.

5. A computer data signal embodied in a carrier wave readable by a computing system and encoding a computer program of instructions for executing a computer process for modulating a voltage controlled oscillator (VCO) system, the computer process comprising:

setting a first variable voltage of a first varactor to a first voltage, setting a second variable voltage of a second varactor to a second voltage in a normal condition;

setting both the first and the second varactors to the first voltage in a positive deviation condition; and setting both the first and the second varactors to the second voltage in a negative deviation condition;

wherein a frequency deviation of the system is linear in response to a voltage deviation from the normal condition to either the positive deviation condition or negative deviation condition.

* * * * *

UNITED STATES PATENT AND TRADEMARK OFFICE
CERTIFICATE OF CORRECTION

PATENT NO. : 6,396,356 B1
DATED : May 28, 2002
INVENTOR(S) : Mehta et al.

It is certified that error appears in the above-identified patent and that said Letters Patent is hereby corrected as shown below:

Column 1,
Line 60, "Lo" should read -- $L_o$ --

Column 4,
Line 5, "$C_{TOTAL/M+}-c_{TOTAL/NOM}$" should read -- $C_{TOTAL/M+}-C_{TOTAL/NOM}$ --

Signed and Sealed this

Thirty-first Day of December, 2002

JAMES E. ROGAN
*Director of the United States Patent and Trademark Office*